United States Patent [19]
Yamazaki et al.
[11] 3,856,587
[45] Dec. 24, 1974

[54] METHOD OF FABRICATING SEMICONDUCTOR MEMORY DEVICE GATE

[76] Inventors: Shumpei Yamazaki, c/o Yamazaki Kogyo K.K.9-7,1-chome Shinkawa, Shizuoka; Ichiro Kagawa, c/o Tokyo Denki Kagaku Kogyo K.K.15-7,2-chome Higashi Ohwada, Tchikawa; Yuriko Sugimura, c/o Yamazaki Kogyo K.K.9-7,1-chome Shinkawa, Shizuoka, all of Japan

[22] Filed: Mar. 20, 1972

[21] Appl. No.: 236,153

[52] U.S. Cl. ................. 148/187, 148/186, 148/175, 148/1.5, 29/571, 317/235 R, 117/201
[51] Int. Cl. ................................................ Ho1l 7/36
[58] Field of Search ............ 148/187, 1.5, 186, 175; 317/235 B; 29/571; 117/201, 215

[56] References Cited

UNITED STATES PATENTS

| | | | |
|---|---|---|---|
| 3,386,163 | 6/1968 | Brennemann et al. | 29/571 |
| 3,514,676 | 5/1970 | Fa | 317/235 B |
| 3,549,411 | 12/1970 | Bean et al. | 117/215 X |
| 3,597,667 | 8/1971 | Horn | 148/187 X |
| 3,649,886 | 3/1972 | Kooi | 317/235 B |
| 3,673,471 | 6/1972 | Klein et al. | 148/175 X |

*Primary Examiner*—G. Ozaki
*Attorney, Agent, or Firm*—Holman & Stern

[57] ABSTRACT

Method of fabricating an insulating coating to be formed on a semiconductor substrate for a semiconductor device providing memory capability by controlling the existence, polarity and amount of charge to be trapped into the insulating coating.

18 Claims, 5 Drawing Figures

METHOD OF FABRICATING SEMICONDUCTOR MEMORY DEVICE GATE

BACKGROUND OF THE INVENTION

Figure 1A:
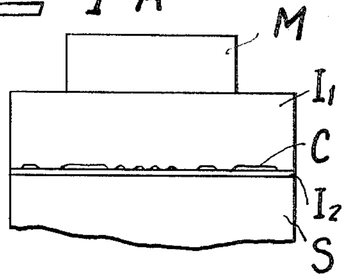

The conventional field effect transistor having a gate of sandwich structure of metal-nitride-oxide-silicon semiconductor or metal-alumina-silicon semiconductor have been thought to utilize trap centers which are formed accidentally.

The applicant has noted, however, that hysteresis phenomena which are found in the C-V characteristics of these transistors stem from trap centers of the cluster or the thin film of metal or semiconductor existing in the insulating coating, or from trap centers existing near the cluster or thin film. From this discovery, the inventive method has been devised as a technique for providing such trap centers.

SUMMARY OF THE INVENTION

This invention relates to a method of fabricating an insulating coating for a semiconductor device providing memory capability by controlling the existence, polarity and amount of charge to be trapped into the said insulating coating to be formed on a semiconductor substrate. The invention features methods of fabricating A a trap center of a cluster or thin film made of metal or semiconductor and B a trap center near the cluster or thin film. The metal or semiconductor cluster or thin film are formed on the interface of multiple insulator coatings or near the said interface.

Up to now, MASFET (for field effect transistor having a gate of sandwich structure of metal-alumina-silicon semiconductor) and MNOSFET (for field effect transistor having a gate of sandwich structure of metal-nitride-oxide-silicon semiconductor) have been known as semiconductor devices featuring the use of trap centers existing in their insulating coatings. The trap centers in MAS or MNOS structure have been considered as a product of inequality in atomic size due to unexpected variation in the process, and thus none of the structures of MAS and MNOS have features to provide the specific trap centers per se.

The inventor hypothesized that the trap center was the cluster or a thin film itslef formed in mass or in flocks made of metal or semiconductor existing in insulating material and also it exists near the cluster or thin film. The present invention relates to a method to form the cluster or thin film being separated from the surface of semiconductor with an essentially constant distance.

The cluster or thin film shall be called the cluster for short in the following description.

Since the cluster operates as a direct current path for leakage current, the distribution of the cluster along the thickness of the insulating coating weakens an insulation characteristic of the coating. The cluster existing near the interface is a function of its distance from the interface. If the distance is insufficient, the charge will be trapped by a specific cluster that exists close to the interface. As a result of this, energy band structure near the interface of the semiconductor substrate will be deformed and the electric characteristic of the semiconductor will deteriorate.

In other words, the control of the current through the semiconductor by the charge to be trapped into the trap center is achieved ideally utilizing the charge to be distributed uniformly with a constant density and a constant distance from the interface.

The invention may be better understood from the following illustrative description and the accompanying drawings.

Figure 1B:
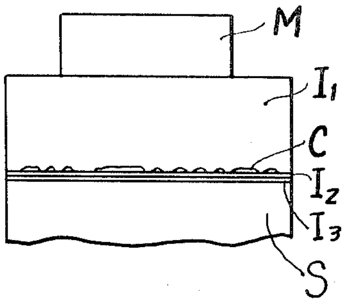
Figure 3:
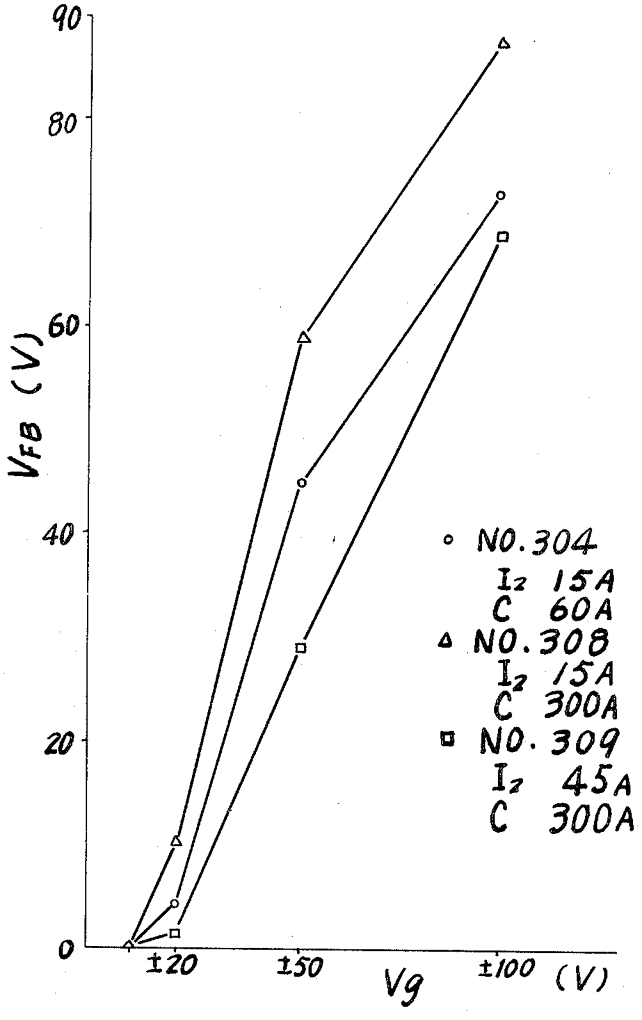
Figure 2A:
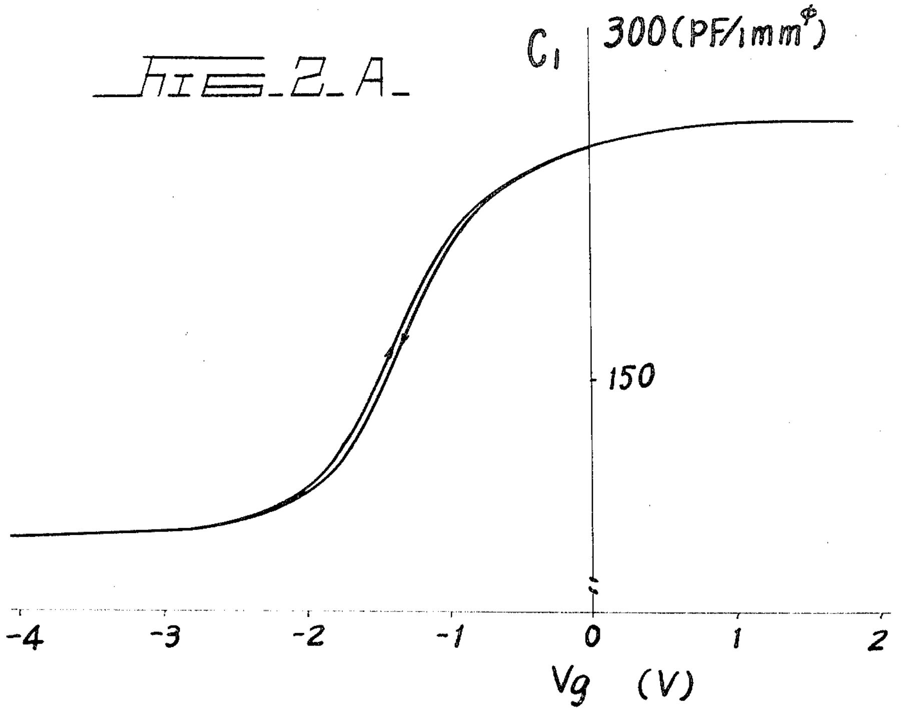
Figure 2B:
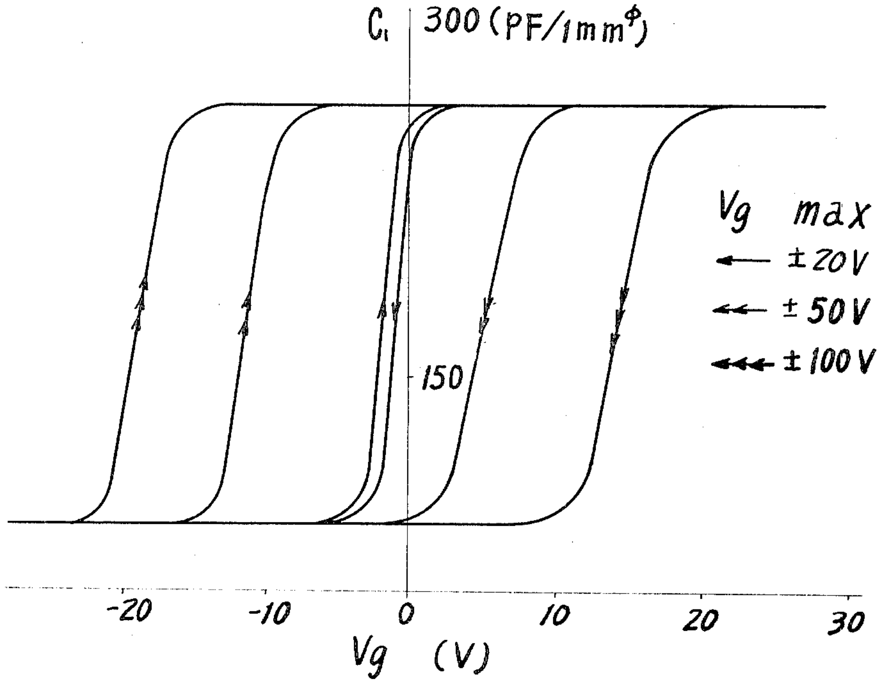
Figure 4A:
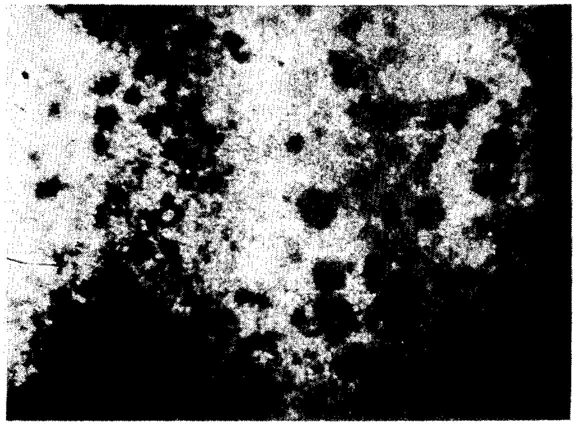
Figure 4B:
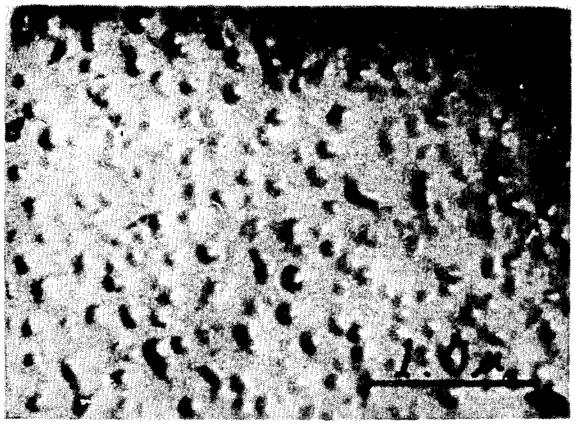
Figure 5:
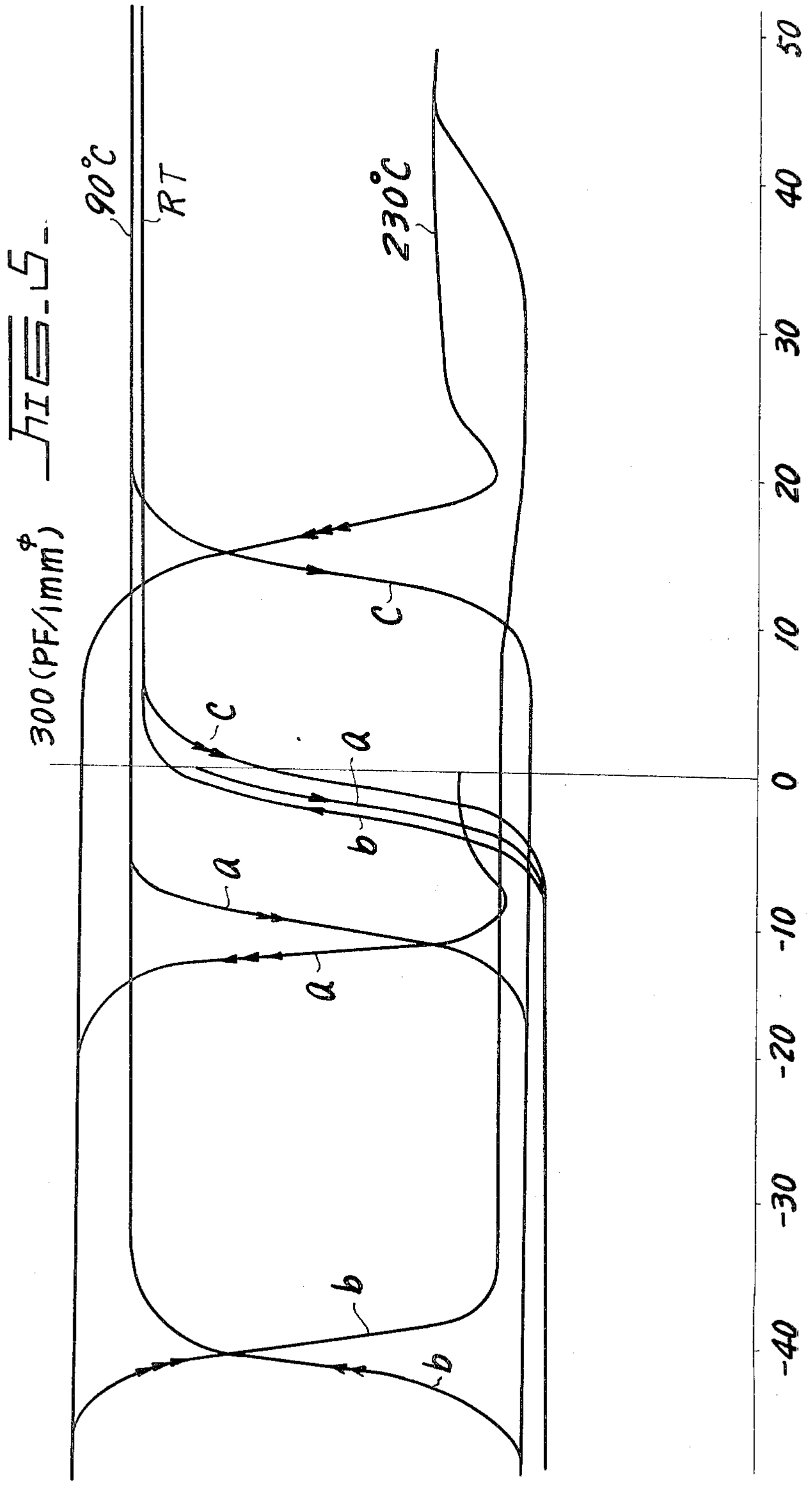

FIG. 1 of the drawings are section views of a MIS diode embodying principles of the invention;

FIG. 2 of the drawings are characteristic curves of the device having the structure shown in the FIG. 1;

FIG. 3 of the drawings is another characteristic curve of the device;

FIG. 4 of the drawings are microscopic photos illustrating the cluster;

FIG. 5 of the drawings is a characteristic curve of the device illustrating catalysis during a simultaneous forming of the cluster and insulating coating.

FIG. 1 shows a gate section of a metal-insulating coating-semiconductor field effect transistor (MISFET) having a sandwich structure. The shape of the cluster is a hemisphere of flock or thin film. The cluster is a flock made of many kinds of atoms which are isolated from each other. In the drawing, one layer of the cluster is shown. However, more than two layers to be formed based on the principles of the invention can be used depending on the application of the device.

In the structure shown, FET functions as a sensor. Therefore, self-aligning type silicon gate MISFET, conventional MISFET, DSAMISFET, etc. are to be derived according to the principles of the present invention. In other words these FETs function as stored information sensors, if the present invention is utilized as a "read mostly memory" (RMM). The present invention can be used to control threshold voltage (Vth) for these FETs, adjusting their insulating coatings. As a general rule, there is no direct relation between the present invention and the structure of the semiconductor devices.

Either metal or semiconductor can be used for the material to form the cluster. In the following discussion, silicon or germanium is used for the cluster as a typical example of the semiconductor material.

Embodiment 1

The embodiment is a method to form the insulating coating having silicon nitride as its cover and consisting of semiconductor clusters of silicon or germanium to be put on an insulator coating in mono-layer or multi-layer formed on a semiconductor substrate. Silicon, germanium, gallium arsenide, etc. can be used for the semiconductor substrate; however, a silicon semiconductor having the impurity concentration of $No = 1 \times 10^{15}$ $cm^{-3}$ and crystallographic axis of (100) was used in the embodiment. Thereafter, the surface of the semiconductor subsrate was cleaned, and an insulating coating in mono-layer or multi-layer was formed on the surface. The mono-layer insulating coating of silicon oxide or silicon nitride was formed using solid-vapor reaction deposition. The substrate was put into either carbon dioxide with or without a carrier gas of nitrogen or hydrogen at 900°C to 1,150°C for thermal oxidation. The thickness of the coating was less than 200A with thermal oxidation in 5 to 30 minutes at 1,000°C to 1,100°C. The substrate was put into either nitrogen or ammonia at 1,000° C to 1,350°C for the formation of a silicon nitride coating through solid-vapor reaction deposition.

As ammonia is to be reduced into nitride at high temperature such as above 1,100°C, care must be taken in dealing with the substrate. An insulating coating of nitride having about 100A in thickness was formed at a temperature of 1,150°C to 1,200°C for 10 minutes to an hour. A silicon oxide insulating coating was deposited by vapor-reaction deposition, that is, silane-oxygen or silane-carbon dioxide at a temperature of 300°C to 800°C.

To keep the deposited thickness less than 200A, the silane to be brought into a reaction furance was maintained at 0.1 $^{cc}$/min. compared to the oxygen or the carbon dioxide of 10 $^{cc}$/min. to 500 $^{cc}$/min.

A silicon nitride insulating coating was deposited by the reaction between the silicide vapor of silane, $SiH_2Cl_2$, $SiHCl_3$ or $SiCl_4$ and the nitride vapor of ammonia or hydrazine at 650°C to 950°C.

The silane flow was 0.2$^{cc}$/min. to 0.4$^{cc}$/min. The ammonia flow was 100$^{cc}$/min. to 300$^{cc}$/min., while the substrate was maintained at 700°C to 800°C.

Nickel, oxide has been used during the reaction as an ammonia decomposition catalyst to activate the reaction gas. In this case, the silane was diluted with hydrogen to get a silicon nitride coating having extremely few clusters and a breaking voltage of $1 \times 10^7$ $^v$/cm. The same phenomena were observed when hydrogen was used as a part or all of the carrier gas along with silane gas.

The cluster of silicon or germanium was formed through a chemical vapor deposition (CVD) or vacuum evaporation. The thickness of the cluster was 200A estimating it had an uniform film-like shape.

The next step, synethsis of a silicon nitride coating, was done through the CVD because no good quality had been obtained through a sputtering process. The cluster made by vacuum evaporation or sputtering will be contaminated or the surface of it will be oxidized before it is put in a reaction furnace for the silicon nitride coating process, because the cluster must be made using facilities other than the reaction furnace.

In the result, insulating coating, cluster and silicon nitride coating were synthesized in the same reaction furnace using the CVD with silane or germane in this embodiment. Of course, a silicide vapor of an organic compound of silane, or a silicon halide such as dichlorosilane, trichlorosilane and silicon tetrachloride can be used in addition to a simple molecule, such as hydride of silicon or germanium.

An insulating coating $I_1$ in FIG. 1 is made of a silicon nitride coating and produced the same as the insulating coating $I_2$ that is produced by the CVD. A conductor electrode M is made of metal such as aluminum or titanium.

The electrode M can be highly doped silcon or germanium instead of the above metal. The substrate is denoted S in FIG. 1 and the cluster is denoted C.

In the embodiment, polycrystal silicon ($\phi MS = 0.8$V, $No = 10^{15}$cm$^{-3}$) doped with boron of $10^{18}$ to $10^{20}$cm$^{-3}$ or germanium ($\phi MS = 0.75$V,$No = 10^{15}$cm$^{-3}$) was used where $\phi$MS and No mean the work function difference between a silicon substrate and a metal gate and the impurity or dopant concentration in a subsrate, respectively.

The coating $I_3$ in FIG. 1(B) was formed at 10 to 500A in thickness through a solid-vapor reaction by silicon oxide and then the coating $I_2$ of silicon nitride was formed at 5 to 500A in thickness through CVD. Conversely the $I_2$ can be made of a silicon oxide coating and the $I_3$, silicon nitride coating. Also, other insulating coatings, such as titanium oxide, tantalum oxide and germanium nitride can be used for the coatings.

When the $I_2$ shown in FIG. 1 (A) is produced as a nitride coating by the CVD, an oxidized coating of several angstroms to 10A in the thickness will be produced under the $I_2$, due to the reaction between the substrate and oxygen in the air. The oxidized coating can be removed by heating it above 900°C for 10 minutes in ammonia gas.

FIG. 2 depicts C-V characteristic by using the structure in FIG. 1 (A). The $I_1$ is produced through the CVD with siilane and ammonia. The coating was formed with the substrate at 700°C to 750°C, the silane at 0.2 to 0.4 $^{cc}$/min., the ammonia at 150 to 200 $^{cc}$/min. and the carrier gas at nitrogen of 2.5 l/min. The growth rate of the coating was one angstrom per second.

The cluster was deposited through the CVD with silane. The deposition was made with the silane at 0.2 to 0.4 $^{cc}$/min. and the substrate was kept at the same temperature as the silicon nitride coating was formed.

The $I_2$ was formed by carbon dioxide at 950°C to 1,100°C diluted 5 to 20% with a carrier gas of nitrogen or hydrogen. The coating can be formed by oxidation in carbon dioxide diluted 5% with nitrogen for 15 minutes followed by heating it 5 minutes with the carrier gas of hydrogen. The silicon oxide coating $I_2$ can be formed using carbon monoxide. FIG. 2(A) depicts C-V characteristics applying $\pm$ 5V as gate voltage. $I_1$ is 1,200A in the thickness, $I_2$, 15A and the silicon 30A.

The $V_{FB}$ is $-1$V and Vth, $-2$ to $-3$V. FIG. 2 (B) is obtained as hysteresis curves changing the value of the applied voltage. The significant curves are obtained at $\pm$50V ($4 \times 10^6$ $^v$/cm) and 70V ($5.5 \times 10^6$ $^v$/cm).

FIG. 3 shows the width ($\Delta V_{FB}$) between the flat band in the hysteresis to be proportional to the value of the gate voltage (Vg). The increase of the gate voltage is symmetric between the right side and the left side. The experiments No. 304 and No. 308 show larger hysteresis to be proportional to the deposition time of silane. The experiments No. 308 and No. 309 show the decreased hysteresis ($\Delta V_{FB}$) in proportion to the increase of the thickness of the $I_2$. Thus, the applied voltage has no effect.

The above experimental data would be explained most readily, if the cause of the hysteresis from the C-V characteristic stemmed from the trap center existing in the coating in the form of a cluster or thin film.

The present invention is characterized by the formation of the cluster being distributed uniformly with a constant distance from the substrate based on the above hypothesis. Embodment 1 conforms to the purpose of the invention forming the cluster or thin film separately.

When the cluster formed simultaneously with the silicon nitride coating, surface reaction shown in Embodiment 2 has to be used. Also, when germane is used, Embodiment 2 has to be used, because the melting point of germanium is lower than silicon and reaction at above 800°C makes the germanium react with the surface to be deposited.

Thus, silicon nitride coating has to be formed at a low temperature. As silicon nitride insulating coating is used for the $I_2$ in the FIG. 1 (A), the reaction through the CVD is the best to reduce the charge existing in the interface.

In the experiment, the deposition time for the silicon nitride was zero (no coating), 10,60 and 200 seconds. The silicon cluster was deposited by silane.

With the deposition time at 300 seconds, a large hysteresis having a similar shape to FIG. 3 in a qualitative manner observed. However was with less than 10 seconds, no appreciable hysteresis was observed.

In FIG. 1, the experiment using silicon nitride coating formed by solid-vapor reaction was tested for the $I_2$.

After the substrate was cleaned completely in ammonia, it was nitrified at 1,150°C. Nitrification was tested at times of zero, 10, 30 and 70 minutes. The observed hysteresis curves were similar to those of FIG. 3. A large hysteresis ($\Delta V_{FB} = 55V$, $E = \pm 3 \times 10^6$v/cm) obtained after 70 minutes nitrification had more interface charges ($5 \times 10^{11}$ to $1 \times 10^{12}$ cm$^{-2}$) and seemed not to be suitable for a gate insulator coating for a MISFET.

During the nitrification, about half the amount of the interface charge was observed while the temperature was kept at 1,300°C.

In the case of a silicon nitride coating made by solid-vapor reaction, the higher the temperature for the nitrification of the substrate the better. In the case of applying the present invention to a gate for a MISFET, it is better to provide an oxide coating on the surface of a silicon semiconductor to improve the interface characteristic between insulator coating and the semiconductor of the FET working as sensor. To that end, oxide vapor such as carbon dioxide or carbon monoxide is kept at 900°C to 1,150°C while conducting the oxidation instead of heating the substrate at 600°C to 700°C to deposit the $I_2$.

The other main feature of the invention is the formation of the $I_2$ made of silicon nitride or germanium nitride coating through the CVD and put on the upper side of the oxide coating ($I_3$) as shown in the FIG. 1 (B). This formation prevents annealing to be followed in the next processing step between the deposited cluster and the silicon oxide coating due to the adsorption of silicon, In this case, the distance between the cluster and the semiconductor substrate has to be made greater and the hysteresis gets smaller. In the experiment, hysteresis similar to that corresponding to the case where no silicon nitride coating existed was obtained for the $I_2$ with the deposition of 5 to 10 seconds.

Embodiment 2

This embodiment is to provide a method to form a silicon cluster on a mono-layered or multi-layered insulating coating formed on a semiconductor substrate by the reaction of the silicon cluster and a nitriding vapor such as ammonia or hydrozine forming silicon nitride coating including very few clusters on the cluster layer at the same time.

So far few considerations have been given to the synthesis of silicon nitride coatings. The present invention uses surface reaction for the deposition of the silicon nitride coating and removes space reaction based on the fact, that is, a cluster source existing in silane is too adhesive to the surface of the substrate and is not adhesive to the newly formed silicon nitride coating.

The experiment was done with a synthesizing temperature of 450°C to 900°C, ammonia or hydrazine, a kind of nitride vapor, at 150 cc/min., silane at 8 $^{cc}$/min. and a diluent of argon, helium and hydrogen at 100 to 200 $^{cc}$/min. for the container of the silane. Only on the surface of the substrate was a silicon cluster deposited.

Helium was the best in the experiment providing good adhesion and very large hysteresis. Next was argon. Hydrogen produced the smallest cluster and the hysteresis in the C - V characteristic was small.

The coating $I_3$ has been formed by the oxidization of the substrate in the oxide vapor through solid-vapor reaction or by the nitrification in the nitride vapor. Good adhesion was observed with the nitride coating.

As discussed above, silane and the cluster source mixed in the silane are too adhesive chemically to the surface already existing and to be deposited, and are not adhesive to the surface being synthesized.

The present invention utilizes the fact and completes this deposition of the silicon cluster and the synthesis of silicon nitride coating at the same time.

Embodiment 1 has much flexibility because the condition for the deposition of the cluster and material other than silicon can be selected in many ways.

FIG. 4 shows microscopic photos of cluster. The A photo shows cluster in the silicon nitride coating produced by space reaction. The cluster has small hystersis because it is included in the coating. The B photo shows a cluster deposited on the surface in hemispheres. The cluster is produced by surface reaction using silane diluted wth helium gas. The photo depicts that the cluster only existing on the surface acts as a charge trap center for a semiconductor memory device.

A catalyst can be used with the formation of silicon nitride coating. When using the diluent of hydrogen or helium for the silane, the resultant cluster to be deposited on the surface is small for the hydrogen diluent and spreads out as a film on the surface for the helium diluent. Therefore, introduction of a catalyst into silane or ammonia is able to control the cluster and the hysteresis curve.

Nickel oxide, iron oxide, platinum, etc. are used for ammonia as a catalyst. For example, a catalyst of nickel oxide at 90°C to 450°C is placed with about 50 cm separation from the surface to be deposited. Copper-zinc, reduced nickel, nickel oxide, etc. are used for silane as a reducing agent and placed with about 30 cm separation from the surface. The temperature of the catalyst is kept at 100°C. The silane diluted with hydrogen makes the hysteresis small. However, it is effective to form the silicon nitride coating of Embodiment 1. The silane diluted with helium makes the cluster thin as a film having a thickness of 500 to 3,000A and the hysteresis in the C-V characteristic large enough. Then, the invention could provide simultaneous depositing, of both the silicon nitride coating and cluster, and controlling the size of the hysteresis. The size of the hysteresis has been controlled by changing the thickness of the coatings for the $I_1$ and $I_2$ as shown in the FIG. 1 and the temperature of the catalyst. FIG. 5 shows the above result. The curve shows that the choice of the catalyst and its temperature exert great influence upon the magnitude of the hysteresis. In FIG. 5, the catalyst temperature was changed from a room temperature (A), 90°C (B) and 230°C (C). The curves were traced from (a) to (c) through (b) by applying the gate voltage in the order of OV→

−50V → OV → + 50V → OV.

The same effect has been observed in the CVD (chemical vapor deposition) for the silicon nitride coating. There, a carrier gas, was used involving helium more than 1% of its volume.

One of the features of the present invention is the use of helium as a part of the diluent for the reaction between a silicide vapor such as silane, dichlorosilane, etc. and a nitriding vapor such as ammonia or hydrazine. These reactive vapors are to be activated by the catalyst.

The present invention has been depicted to distribute the cluster or the thin film uniformly while keeping a constant distance from the surface of the semiconductor. To make the cluster or the thin film, impurities such as magnesium, beryllium, aluminum, boron, phosphorus, arsenic, etc. found in groups II, III and V of the periodic table or the halides or hydrides of these elements such as phosphine or diborane are used.

The impurities of group II elements have a small work function and promote the injection of electrons or holes from the substrate to the cluster or the thinfilm. It was found that the impurities of groups III and V could not control the energy level of the cluster. In the embodiments reactive vapor such as silane or germane has been used for the CVD of a silicon or germanium cluster. However, halides such as silicon tetrachloride, trichlorosilane, dichlorosilane, etc. can be used as reactive material.

Also, semiconductor cluster and metal cluster can coexist according to the present invention. As described above, the invention clarifies the trap center that used to exist accidentally in the insulator coating to be formed on the surface of semiconductor and provides a method to fabricate the trap center to be distributed uniformly with specified density with constant distance from the semiconductor surface, The MISFET fabricated in accordance with the invention and the nonvolatile memory devised by the invention are believed to be greatly worthwhile in the field of industrial application.

What is claimed is:

1. The method of fabricating the gate of a semiconductor memory device, which comprises depositing a thin insulating coating in at least a mono-layer on a surface of a semiconductor substrate, forming a semiconductor cluster or a thin film made of silicon or germanium on the thin insulating coating, and forming a silicon nitride coating on the top of the cluster or thin film, thereby forming memory capability controlling the existence, polarity and amount of charge to be trapped into the insulating coating.

2. The method as in claim 1, wherein the cluster or thin film of silicon is made from silane, dichlorosilane, trichlorosilane or silicon tetrachloride.

3. The method as in claim 1, wherein the cluster or thin film of germanium is made from germane or germanium halide.

4. In a method of fabricating the gate of a semiconductor device having memory capability controlling the existence, polarity and amount of charge to be trapped into an insulating coating of the semiconductor device, the improvement comprising fabricating the insulating coating by depositing a thin insulating coating in at least a mono-layer on a surface of a substrate of the semiconductor device, and forming simultaneously a silicon cluster on said thin insulating coating and a silicon nitride coating on said silicon cluster by a surface reaction between a nitriding vapor and a silicide vapor involving said silicon cluster or a cluster source.

5. The method as in claim 4, wherein the thin insulating coating is made of silicon oxide or silicon nitride.

6. The method as in claim 5, wherein the thin silcon oxide coating has a thickness of less than 200A.

7. The method as in claim 6, wherein the thin silicon oxide coating is formed by oxidizing a surface of silicon semiconductor substrate using carbon dioxide or carbon monoxide diluted with hydrogen or nitrogen at 900°C to 1,150°C.

8. The method as in claim 4 wherein said silicide vapor is selected from the group consisting of silane, dichlorosilane, trichlorosilane, silicon tetrachloride and an organic compound of silane.

9. The method as in claim 8, wherein said silane is diluted with helium.

10. The method as in claim 8, wherein said silicide vapor is diluted with a carrier gas comprising helium.

11. The method as in claim 4, wherein the said silicon nitride coating has no cluster or has very few clusters.

12. The method as in claim 11, wherein the said silicon nitride coating is synthesized by reacting silane diluted with hydrogen and ammonia in the presence of a catalyst.

13. The method as in claim 4, wherein the nitriding vapor to be used for the synthesis of the silicon nitride coating comprises ammonia or hydrazine.

14. The method as in claim 4, wherein a catalyst is used for the synthesis of the silicon nitride coating to activate or decompose reactive vapor.

15. The method as in claim 14 wherein the catalyst is nickel oxide, iron oxide, platinum, copper-zinc or reduced nickel.

16. The method as in claim 15, wherein the catalyst is used at the range of 90°C to 450°C.

17. The method as in claim 14, wherein the said semiconductor substrate is silicon, germanium or gallium arsenide.

18. The method as in claim 4, wherein said cluster and silicon nitride coating on said cluster are synthesized using chemical vapor deposition.

* * * * *